United States Patent [19]
Zampini et al.

[11] Patent Number: 5,529,880
[45] Date of Patent: Jun. 25, 1996

[54] PHOTORESIST WITH A MIXTURE OF A PHOTOSENSITIVE ESTERIFIED RESIN AND AN O-NAPHTHOQUINONE DIAZIDE COMPOUND

[75] Inventors: Anthony Zampini, Westborough; Peter Trefonas, III, Medway, both of Mass.

[73] Assignee: Shipley Company, L.L.C., Marlborough, Mass.

[21] Appl. No.: 413,081

[22] Filed: Mar. 29, 1995

[51] Int. Cl.$^6$ ............................... G03F 7/023; G03F 7/30
[52] U.S. Cl. .......................... 430/190; 430/192; 430/193
[58] Field of Search ................................... 430/190, 165, 430/192, 193

[56] References Cited

U.S. PATENT DOCUMENTS

| | | | |
|---|---|---|---|
| 3,046,120 | 7/1962 | Schmidt et al. | 430/192 |
| 4,306,011 | 12/1981 | Uehara et al. | 430/190 |
| 4,477,553 | 10/1984 | Yamamoto et al. | 430/190 |
| 4,957,846 | 9/1990 | Jeffries, III et al. | 430/165 |
| 5,178,986 | 1/1993 | Zampini et al. | 430/190 |
| 5,216,111 | 6/1993 | Zampini | 528/143 |
| 5,238,776 | 8/1993 | Zampini | 430/192 |
| 5,266,440 | 11/1993 | Zampini | 430/192 |
| 5,279,918 | 1/1994 | Nishi et al. | 430/190 |
| 5,380,622 | 1/1995 | Roser | 430/190 |
| 5,419,995 | 5/1995 | Zampini | 430/192 |
| 5,422,221 | 6/1995 | Okazaki et al. | 430/190 |

FOREIGN PATENT DOCUMENTS

| | | | |
|---|---|---|---|
| 1227602 | 4/1971 | United Kingdom | 430/190 |

*Primary Examiner*—John S. Y. Chu
*Attorney, Agent, or Firm*—Robert L. Goldberg

[57] ABSTRACT

A photoresist that is a mixture of the esterification product of an o-quinonediazide compound and a novolak resin and a high molecular weight phenol having from 2 to 5 phenolic groups and at least 4 diazo naphthoquinone groups. The extent of esterification of the novolak resin is up to 20 percent of the hydroxyl groups and the degree of esterification of the phenol is at least 50 percent of the phenolic hydroxyl groups. The preferred novolak resins are the aromatic novolak resin that are the condensation product of a reactive phenol with a bis(hydroxymethyl)phenol or an aromatic aldehyde, each alone or in the presence of a reactive phenol.

24 Claims, No Drawings

PHOTORESIST WITH A MIXTURE OF A PHOTOSENSITIVE ESTERIFIED RESIN AND AN O-NAPHTHOQUINONE DIAZIDE COMPOUND

BACKGROUND OF THE INVENTION

I. Introduction

This invention relates to new photoresist compositions. More particularly, this invention relates to positive working photoresist compositions containing a mixture of photoactive compounds. One component of the mixture is the esterification product of an o-quinonediazide sulfonyl compound with a phenolic resin. Another component of the mixture is the esterification product of an o-quinonediazide sulfonyl group with a high molecular weight phenol having from two to five aryl rings and at least four hydroxyl groups.

II. Description of the Prior Art

Photoresist compositions are well known in the art and described in numerous publications including DeForest, *Photoresist Materials and Processes,* McGraw-Hill Book Company, New York, 1975. Photoresists comprise coatings produced from solution or applied as a dry film which, when exposed to light of the proper wavelength, are chemically altered in their solubility to certain solvents (developers). Two types are known. The negative-acting resist is initially a mixture which is soluble in its developer, but following exposure to activating radiation, becomes insoluble in developer thereby defining a latent image. Positive-acting photoresists work in the opposite fashion, light exposure making the resist soluble in developer.

Positive-working photoresists are more expensive than negative-working photoresists but are capable of providing superior image resolution. For example, the positive-working photoresist described above can be developed to yield relief images with a line width as low as one micron or less. In addition, considering the cross-section of a photoresist image, the channels formed in the photoresist by development have square corners and sidewalls with only minimal taper.

The positive-working photoresists typically comprise a light-sensitive compound in a film-forming polymer binder. The light-sensitive compounds, or sensitizers as they are often called, most frequently used are esters and amides formed from o-quinone diazide sulfonic and carboxylic acids. These esters and amides are well known in the art and are described by DeForest, supra, pp. 47–55, incorporated herein by reference. These light-sensitive compounds, and the methods used to make the same are all well documented and described in prior patents including German Patent No. 865,140 granted February 2, 1953 and U.S. Pat. Nos. 2,767,092; 3,046,110; 3,046,112; 3,046,119; 3,046,121; 3,046,122; and 3,106,465, all incorporated herein by reference. Sulfonic amide sensitizers that have been used in the formulation of positive-acting photoresists are shown in U.S. Pat. No. 3,637,384, also incorporated herein by reference. These materials are formed by the reaction of a suitable diazide of an aromatic sulfonyl chloride with an appropriate resin amine. Methods for the manufacture of these sensitizers and examples of the same are shown in U.S. Pat. No. 2,797,213, incorporated herein by reference. Other positive-working diazo compounds have been used for specific purposes. For example, a diazo compound used as a positive-working photoresist for deep U.V. lithography is Meldrum's diazo and its analogs is described by Clecak et al., "Technical Disclosure Bulletin," Volume 24, No. 4, September 1981, IBM Corporation, pp. 1907 and 1908, and o-quinone diazide compounds suitable for laser imaging as shown in U.S. Pat. No. 4,207,107. The aforesaid references are also incorporated herein by reference.

The resin binders most frequently used with the o-quinone diazides in commercial practice are the alkali-soluble phenol formaldehyde resins known as the novolak resins. Photoresists using such polymers are illustrated in U.K. Patent No. 1,110,017, incorporated herein by reference. These materials are the product of reaction of a phenol with formaldehyde, or a formaldehyde precursor, under conditions whereby a thermoplastic polymer is formed.

In the prior art, the above-described positive photoresists using novolak resins as binders are most often used as a mask to protect substrates from chemical etching and photoengraving processes. For example, in a conventional process for the manufacture of printed circuit boards, a copper clad substrate is coated with a layer of a positive-working photoresist, exposed to actinic radiation to form a latent circuit image in the photoresist coating, developed with a liquid developer to form a relief image, and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and for high density circuits, must be capable of fine-line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by the development of the photoresist are dissolved while the portions of the wafer coated with photoresist are protected, thereby defining a circuit pattern. For use in the manufacture of a semiconductor, the photoresist must possess resistance to chemical etchants, must adhere to the surface of the semiconductor wafer, and must be capable of very fine-line image resolution.

Recent developments in photoresist technology involve processes where high temperatures are encountered. For example, a recent development in the fabrication of semiconductors substitutes dry plasma etching or wet chemical etching to define a circuit. Plasma etching provides advantages over wet chemical etching in that it offers process simplification and improves dimensional resolution and tolerance. However, the demands on the photoresists are significantly greater when using plasma etching. For both wet etching and plasma etching, the photoresist must adhere to the substrate and must be capable of fine-line image resolution. For plasma etching, in addition to these properties, the photoresist must often be capable of withstanding high temperatures without image deformation and without eroding as plasma etching generates high temperatures at the wafer's surface.

The above-described prior art positive-working photoresists provide good resistance to chemical etchants and fine-line image resolution. However, they possess a relatively low glass transition temperature and soften and begin to flow at temperatures of approximately 120° C. thereby resulting in image distortion and poor image resolution.

Various methods have been used in the prior art to increase the thermal performance of positive-working photoresists. For example, attempts have been made to increase the molecular weight of the novolak resins by chain extension, incorporation of di- and tri-alkyl substituted phenols and by use of higher molecular weight phenolic reactants. One method reported in the prior art involves increasing the aromaticity of the novolaks by replacing formaldehyde or other alkyl aldehydes used to form novolak resins with an aromatic aldehyde such as benzaldehyde. The substitution of benzaldehyde for formaldehyde is suggested by Hiraoka et al., "Functionally Substituted Novolak Resins, Lithographic Applications, Radiation Chemistry, and Photooxidation," Polymer Press (American Chemical Society, Division of Polymer Chemistry), Volume 25, No. 1, 1984, pp. 322–323. An additional method reported in U.S. Pat. No. 5,266,440 involves the use of resin blends or resin additives where one component of the blend has a high glass transition temperature.

Initial attempts to substitute aromatic aldehydes for aliphatic aldehydes were relatively unsuccessful because the aromatic aldehydes are substantially less reactive than the aliphatic aldehydes. Consequently, the resins formed by the substitution were relatively low molecular weight oligomers having softening temperatures comparable to those resins formed with aliphatic aldehydes. Relatively higher molecular weight aromatic novolak resins are disclosed in U.S. Pat. Nos. 5,216,111 and 5,238,776, incorporated herein by reference. In accordance with the procedures set forth in U.S. Pat. No. 5,238,776, a first aromatic novolak resin is formed by the condensation of a bis-hydroxymethyl phenol with another reactive phenol in the absence of an aldehyde to form an alternating novolak copolymer. In accordance with the procedures of U.S. Pat. No. 5,216,111, a phenol is reacted with an aromatic aldehyde to produce a novolak resin. The aromatic novolak resins produced by either patent can then be chain extended to increase molecular weight and thermal properties by further reaction with an aldehyde which may be an aliphatic or aromatic aldehyde to form a block copolymer; or by reaction with an aldehyde which may be an aliphatic or aromatic aldehyde with another phenol to form a block copolymer; or by reaction with a bishydroxymethylated phenol alone or in combination with an additional reactive phenol. The polymers formed by the reactions described in said patents have glass transition temperatures well in excess of the conventional novolak resins formed by reaction of a phenol with an aliphatic aldehyde.

In addition to those efforts directed towards increasing glass transition temperature of novolak resins by increasing their aromaticity, efforts have also been made to provide single component photoresists by combination of the photoactive component of the photoresist with the resin component by esterification of an o-quinone diazide sulfonyl compound with the phenolic hydroxyl group of the novolak resin. An early patent showing this reaction is U.S. Pat. No. 3,046,120, granted Jul. 24, 1962, where an o-cresol formaldehyde resin is esterified with a naphthoquinone-(1,2)-diazide-(2)-5-sulfonyl chloride. The resulting product was used for fabrication of printing plates. Additional efforts to combine a photoactive compound with a phenolic resin are reported in U.S. Pat. Nos. 3,635,709; 4,123,279; and 4,306,011, each incorporated herein by reference.

It is believed that the photoresist compositions described in each of the above patents have not been fully suitable for current submicron resolution (<1.0 μm) requirements. It is further believed that the reason that such photoresists are not fully suitable for commercial use is that photolithographic and other properties of the photoresist are compromised by both the selection of the resin structure and its subsequent esterification with the photoactive compound. For example, the esterification reaction consumes phenolic hydroxyl groups on the resin which groups are necessary for development of a photoresist coating. Therefore, when the hydroxyl groups are consumed, developability of the photoresist coating is compromised unless exposure energy is increased substantially to yield sufficient acidic groups to enable dissolution. Using such materials, residue-free development is difficult.

A recent effort to formulate a photoresist comprising the esterification product of a phenolic resin and an o-quinone diazide sulfonyl compound is disclosed in U.S. Pat. No. 5,279,918, granted Jan. 18, 1994, and incorporated herein by reference. The object of this patent is to provide a photoresist composition having resolution higher than conventional photoresists, a "practical sensitivity" and an image having a good pattern profile. This is achieved by condensing o-quinone diazide sulfonyl compound groups with relatively low molecular weight novolak resins with from 40 to 90 percent of the phenolic hydroxyl groups condensed with the o-quinone diazide sulfonyl group. It is believed that the objects of higher resolution and enhanced pattern profile are achieved because of the high concentration of o-quinone diazide units on the novolak resin backbone. However, a high concentration of the o-quinone diazide units substantially increases the cost of the photoresist. Moreover, it is further believed that low molecular weight novolak resins are required to enable development following exposure at a commercially acceptable energy dose because of the substantial number of phenolic hydroxyl groups esterified with the o-quinonediazide sulfonyl halide. This is shown by the experimental data given that "practical sensitivity" as a stated object of the patent means a substantially higher exposure dose than required for conventional photoresists to obtain clean development.

In copending U.S. patent application Ser. No. 08/413,089 filed contemporaneously herewith and assigned to the same assignee as herein, a photoresist composition is disclosed comprising the esterification product of an o-quinonediazide sulfonyl compound and an aromatic novolak resin with control of the reaction conditions and reactant concentrations whereby a maximum of 20% of the phenolic hydroxyl groups are esterified. By selection of certain aromatic novolak resins for esterification with the o-quinonediazide sulfonyl compound, it was found that the advantages of high image resolution and high glass transition temperature could be retained with limited consumption of phenolic hydroxyl groups through esterification. As a consequence of the limited consumption of hydroxyl groups, the dissolution properties of the photoresist are retained at conventional exposure dosage permitting clean development of imaged photoresist coatings. One disadvantage of a photoresist layer formed from an esterified novolak resin photoresist, whether aromatic or conventional, is a high incidence of standing waves due to thin film interference effects. Consequently, standing wave problems interfere with commercial utility of such materials.

SUMMARY OF THE INVENTION

In accordance with the subject invention, it has been found that the incidence of standing waves is minimized by use of a photoresist composition comprising a novolak resin having phenolic hydroxyl groups esterified with o-quinonediazide sulfonyl groups and an additional photoactive component that is a the esterification product of o-quinonediazide sulfonyl groups with a high molecular weight phenol having from two to five aryl groups and at least four hydroxyl groups, where at least 50 percent of its phenolic hydroxyl groups are esterified with the o-quinone diazide sulfonyl compound. Accordingly, the photoresist of the invention comprises a mixture of photoactive compounds where one component of the mixture is the esterification product of an o-quinone diazide sulfonyl group with a novolak resin and another component of the mixture is the esterification product of o-quinonediazide sulfonyl compound with the above described high molecular weight phenol.

Though not wishing to be bound by theory, it is believed that standing waves are reduced in accordance with the invention because standing waves within a resist film are formed as a result of interference between incident light and light reflected off the substrate which creates nodes of constructive interference within the film where the local exposure is high and antinodes of destructive interference where the local exposure is low. In addition, the variations of exposure within the film create a stratification of the latent image in which the film has alternating layers of highly exposed resist and minimally exposed resist. Further, if the resist film is developed in a high contrast process at the resulting image profile will show scalloped sidewalls. When the exposure dose is low, the developer exhibits difficulty in "punching through", or developing out, the standing waves at the anti-nodes of exposure. When the image is in an out-of-focus condition, developer punch through and resist cleanout during development is impaired. Another difficulty is the presence of scalloped sidewalls is considered deleterious to some etch processes. Scalloped sidewalls can also interfere with metrological measurements.

Because of the above difficulties, it is now a common practice to subject a resist film to a post-exposure bake to ameliorate the problems associated with standing waves. It is believed that certain resist components, namely unexposed and/or exposed photoactive compounds, diffuse within the film at the elevated temperatures experienced during the post exposure bake. This diffusion reduces the distinction between the light-interference produced strata within the latent image by an intermixing mechanism. The diffused film when subjected to developer will now produce images with smooth, or smoother, sidewalls. In most cases, the defocus response (focus latitude) of the resist is improved by a post-exposure bake process which sufficiently diffuses the photoactive compound throughout the film. Similarly the photoresist exposure latitude is also often improved.

There are limits to the temperature a photoresist film can be subject to during a post exposure bake to drive photoactive compound diffusion because the o-quinone diazide moieties will thermally decompose. Larger molecular species are known to typically exhibit a smaller diffusion constant and hence, a shorter diffusion length in a film as compared to smaller molecular species. Often, in order to cause sufficient diffusion of larger molecular species, it is necessary to increase the bake temperature or bake time. However, there are limits to which this can be practiced, as described above, due to thermal decomposition.

Very large molecules, such as o-quinone diazide esterified polymers, do not appear to diffuse readily at bake temperatures below the limits of thermal decomposition. Hence, one disadvantage of using a photoresist composition which contains photoactive components that are exclusively o-quinone diazide esterified polymers is the presence of significant standing waves and scalloped image sidewalls after development, even if a reasonable post exposure bake process is applied.

It has been found that by adding a mobile photoactive compound species to a photoresist formulation also containing very large polymer-bound photoactive compounds can result in a very significant reduction in the incidence of standing waves. Because, in most cases, photoactive compounds formed from mobile polyhydroxy phenols with approximately 2 to 5 diazonaphthoquinone groups per photoactive compound molecule offer high contrast and good resolving and other lithographic performance, it is most advantageous to mix these photoactive compounds with polymer bound photoactive materials. In such a manner, post exposure bake driven diffusion of such polyhydroxy photoactive compounds will reduce the significance of standing waves. Because both the polymeric photoactive compounds and the polyhydroxy photoactive compound offer good dissolution contrast, the resulting use of both together will provides substantially improved lithographic performance. during post exposure bake.

DESCRIPTION OF THE PREFERRED EMBODIMENTS

As described above, the subject invention relates to a photoresist that is the combination of an esterification product of a novolak resin and the esterification product of a high molecular weight phenol. Standing waves are reduced using substantially any novolak resin esterified with an o-quinonediazide sulfonyl acid group admixed with the esterification product of the high molecular weight phenol. However, the esterified aromatic novolak resin of copending U.S. patent application Ser. No. 08/413,089 is preferred for purposes of this invention.

For purposes of the invention described herein, the term "aromatic novolak resin", as used herein, refers to a novolak resin formed by condensing a phenol with a functional aromatic reactant capable of reacting with said phenol such as an aromatic aldehyde, a bis-hydroxymethylated phenol, or the combination of an aromatic aldehyde and a bis-hydroxymethylated phenol to form a novolak resin. The term also includes within its scope aromatic novolak resins further reacted with an additional aldehyde or a functional aromatic reactant alone or in combination with additional phenols to form alternating or block copolymers.

A method for the formation of an aromatic novolak resin by reaction of a phenol with an aromatic aldehyde is disclosed in U.S. Pat. No. 5,216,111, referenced above. In accordance with the procedure of that patent, the aromatic novolak resins are acid catalyzed condensation products of one or more phenols and an aromatic aldehyde formed by the condensation of the reactants in the presence of a strong organic or mineral acid optionally in the presence of a divalent sulfur compound as a co-catalyst under reaction conditions set forth in the above-referenced patent. The phenol is of the type conventionally used in the formation of novolak resins, such as, for example, phenol itself, the cresols, xylenols, resorcinols, naphthol, bisphenols such as 4,4'-isopropylidenediphenol and mixtures of such phenols. Preferred phenols for purposes of the invention include the cresols, m-cresol being most preferred because it yields a polymer having a narrow molecular weight distribution.

The aromatic novolak resin is desirably formed by condensation of the phenol with an aromatic aldehyde. The aromatic aldehyde is preferably one conforming to the following formula:

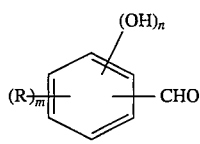

where R is a member selected from the group consisting of halogen, cyano, nitro, carboxyl, alkoxy or alkyl having from 1 to 5 carbon atoms; m is a whole integer ranging between 0 and 2, and n is a whole integer ranging between 0 and 3. Preferred aromatic aldehydes are those where a hydroxyl group is in a position ortho to the carbonyl group. Most preferred aromatic aldehydes are salicylaldehyde, benzaldehyde and mixtures of the two. Other aromatic aldehydes suitable for purposes of the invention include 2-chlorobenzaldehyde, 3-hydroxybenzaldehyde, 4-hydroxybenzaldehyde, 2-methoxybenzaldehyde, 3-nitrobenzaldehyde, etc. Mixtures of aromatic aldehydes may also be used. In a lesser preferred embodiment, the aromatic aldehyde may be mixed with formaldehyde or a formaldehyde precursor such as paraformaldehyde if desired. However, the aromatic aldehyde preferably is in molar excess of formaldehyde, more preferably comprises at least 90 % by weight of the aldehyde mixture, and most preferably is the only aldehyde used to form the resin.

The aromatic novolak resins are formed by condensing the phenol with the aromatic aldehyde in the presence of an acid. The molar concentration of the aromatic aldehyde may be slightly less than that of the phenol, but unexpectedly, may also be equivalent to or slightly in excess of the phenol without formation of a crosslinked resin. In this respect, the ratio of the phenol to the aromatic aldehyde may vary between about 1.1 to 1.0 and 1.0 to 1.1.

Aromatic aldehydes, compared to formaldehyde, are less reactive towards condensation reactions leading to polymerization. However, under more vigorous reaction conditions, aromatic aldehydes can condense with a reactive phenol in the presence of a strong mineral or organic acid such as hydrochloric acid, sulfuric acid, or toluene sulfonic acid. The condensation of the aromatic aldehyde with a reactive phenol results in the formation of polymers that are of high molecular weight typically having a weight average molecular weight in excess of 1500 Daltons and often in excess of 2500 Daltons. Further, with respect to molecular weight, it has been found that the aromatic novolak resins have a narrower molecular weight distribution compared to novolak resins formed using formaldehyde as the condensation reactant. In addition to increased molecular weight, the resins have improved glass transition temperatures generally in excess of 125° C. and often in excess of 175° C.

The condensation of the aromatic aldehyde with the phenol is conducted by mixing the reactants and catalysts in a dehydrating non-interfering solvent in a reactor and refluxing the mixture at an elevated temperature for a period of time sufficient to form a polymer of at least the weight average molecular weight given above. The reactor may be any conventional condensation reactor equipped with an agitator, means for reflux and distillation, and conventional heat transfer means as required to perform the reaction. In general, a preferred method for carrying out the condensation reaction is to dissolve the aromatic aldehyde and the phenol in an appropriate dehydrating water miscible solvent, then add the acid catalyst and, if used, an ionizable divalent sulfur compound. The resultant mixture is agitated and heated to reflux over a period of time ranging from about 0.2 to 48 hours, during which time, the phenol and the aldehyde condense. The condensation reaction typically involves the initial formation of low molecular weight intermediates which then combine with each other at a later stage in the reaction to form higher molecular weight polymers.

Following reflux, excess water may be removed from the condensate and the condensate may then be subjected to distillation at a temperature of from 130° to 180° C. to complete the condensation reaction. Whether or not subjected to distillation and a higher temperature, the resin solution may then be treated to remove undesired impurities and then typically diluted with more solvent and added to excess water to precipitate the resin. The resin is then washed with water and dried at elevated temperature under vacuum. The resin will typically have a glass transition temperature of at least 125° C.

An alternative method for formation of the aromatic novolak resin comprises reaction of a reactive phenol with a bis-hydroxymethyl phenol in accordance with the procedures set forth in U.S. Pat. No. 5,238,776, referenced above. The procedure may be conducted in the absence of an aldehyde or in the presence of an aldehyde such as an aromatic aldehyde. In accordance with procedures given in the aforesaid patent, bis-hydroxymethylated phenols that are particularly useful are represented by the following structures:

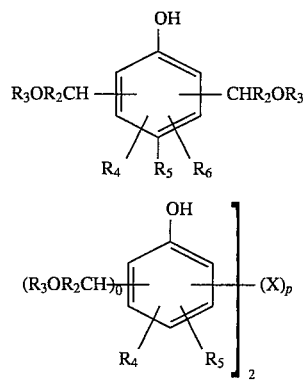

where in each formula as applicable, o is a whole integer equal to 1 or 2, p is an integer equal to 0 or 1; $R_2$ is hydrogen, an alkyl, an aryl, or a heterocyclic group, but preferably is H; $R_3$ is hydrogen, an alkyl or an acyl group, but preferably is hydrogen or methyl; $R_4$ and $R_5$ are individually hydrogen, halogen, an alkyl group, an alkoxy group having 1 to 4 carbon atoms, a phenoxy group, any aryl group or an arylalkyl group; and $R_5$ is the same as $R_4$ and $R_6$, and in addition a carboxylic group; and X is a bridging group which may be alkylene having 1 to 3 carbon atoms, —O—, —S—, —SO— or —SO$_2$—.

The bishydroxymethyl phenols may be formed by the reaction of formaldehyde with a phenol in the presence of a base. Suitable phenols include o-cresol, m-cresol, p-cresol, phenol, 2-phenylphenol, 3-phenylphenol, 4-phenylphenol, 2,3-dimethylphenol, 3,4-dimethylphenol, 3,5-dimethylphenol, 2,3,5-trimethylphenol, 3,4,5-trimethylphenol, p-ethylphenol, p-propylphenol, p-butylphenol, p-nonylphenol, p-tolylphenol, bromophenols, fluorophenols, chlorophenol, trimethylsilylphenol, chloromethylphenols, acylphenols, p-hydroxybenzoic acid, p-nitrophenol, bis(hydroxyphenyl)methane, isopropylidenebisphenol, biphenol, p-cresol formaldehyde dimers and trimers and the like, in the presence of a base. Suitable bases which will promote the reaction include sodium and potassium hydroxide and tetramethyl ammonium hydroxide.

The bishydroxymethyl groups of the above phenols are reactive and in the presence of heat and acid, react with each other or the ring of other reactive phenols to form alternating copolymers. Such phenols include phenol, cresols, dimethylphenols, trimethylphenols, naphthol, biphenols, phenylphenols, bisphenols, bis(hydroxyphenyl)methane, isopropylidenebisphenols, catechols, resorcinols, thiobiphenols, low molecular weight oligomers of phenols and the like, which contain at least two sites in the aromatic ring(s) of sufficient reactivity to undergo facile Friedel-Crafts reactions. The condensation reaction of the reactive phenol with the bishydroxymethylated phenol will sustain polymerization and result in the formation of alternating copolymers. To obtain the desired alternating copolymers, the reaction is conducted in the absence of an aldehyde. If an aldehyde is present in the reaction mixture during the formation of the alternating copolymer, than a polymer is formed that contains segments having both the alternating and random copolymer features. Such a polymer is substantially an alternating block copolymer. Other alternating block copolymer structures may be formed by first reacting the reactive phenol with an aldehyde to form a random structure and then introducing into the reaction mixture the bishydroxymethylated phenolic compound and reacting it with the reactive phenol and the random polymer structure. Alternatively, the bishydroxymethylated phenol is reacted first with the reactive phenol and then an aldehyde is added to the reaction mixture containing unreacted phenol to form the alternating block copolymer. Additional alternating block copolymer structures may be formed by reacting preformed alternating copolymers with preformed random copolymers with either or both an aldehyde and a bishydroxymethylated compound with or without the presence of a reactive phenol.

To prepare polymers having utility according to the invention, the reactants are dissolved in an appropriate non-reactive or non-interfering solvent and then catalyst is added. When desired, the same or additional reactants may be added at different stages of the polymerization process. When a volatile reactive phenolic is used in excess, it may also serve as a solvent or cosolvent. The condensation reaction leading to polymer formation can be carried out below, at, or above ambient temperature. It is generally more practical to conduct the reaction at elevated temperature. A suitable acid catalyst may be a mineral acid such as hydrochloric acid, sulfuric acid, phosphoric acid, or an organic acid such as oxalic acid, maleic acid, formic acid, toluenesulfonic acid and the like or acid cation exchange resins such as those having a sulfonic acid group. In certain cases, an inorganic catalyst may also be used. Such catalysts may include compounds of zinc, manganese, magnesium, aluminum, titanium, copper, nickel and cobalt. Upon completion of the condensation reaction, the solvent and unreacted reactive phenolic compound may be removed by volatilization under reduced pressure and elevated temperature. The preferred method of recovering the polymer from the reaction mixture is by precipitation of the polymer into liquid which is a non-solvent for the polymer but a solvent for the reaction solvent, catalyst, and unreacted reactants. If this precipitation approach is used, the polymer is dried at elevated temperatures under reduced pressure. The resulting polymer may be either substantially an alternating copolymer or an alternating block copolymer structure.

To form a block copolymer, the aldehyde used includes any aldehyde containing the RCHO functionality, including without limitation, alkyl aldehydes and aromatic aldehydes. Preferred aldehydes include formaldehyde, benzaldehyde, salicylaldehyde, and mixtures thereof. An additional phenol may be included in the reaction mixture such as those identified above.

Two differing procedures may be used for formation of an alternating copolymer. The melt process comprises dissolution of the reactive phenol, the bishydroxymethylated phenol, water, solvent and catalyst in a resin reactor followed by gentle heating to about 60° C. to initiate the reaction. An exothermic condensation reaction ensues. After about 3 to 6 hours of reflux, the volatile components are removed by distillation at ambient pressure. When the temperature of the reaction mixture reaches about 220° C., vacuum is applied to remove the unreacted phenol. The resin melt is then poured into a tray and allowed to cool and solidify. In this reaction, the ratio of phenol to bishydroxymethylated phenol is typically 2:1 to about 1:0.9. The catalyst may be any of the acids identified above, the preferred being oxalic and hydrochloric. These are normally used within a range of from about 0.1 to 3.0 percent.

The solution process comprises dissolution of the reactive phenol, bishydroxymethylated phenol, solvent and catalyst in a resin reactor followed by gentle heating to reflux. The reaction temperature may vary from 68° to over 170° C. depending on the boiling point of the solvent, concentration of reactants, and catalyst in the solvent. Typical reaction times vary from 1 to 24 hours, usually around five hours. Suitable solvents for the reaction are the water miscible aprotic or protic type of materials. Some solvent examples are ethanol, diglyme, monomethylether of propylene glycol, propionic acid and dioxane. These solvents may be used alone or in combination. Total monomer concentration in the solvent or solvent mixture is usually in the 5 to 75 % weight range relative to the solvent, preferably in the 10 to 30% range. Preferred catalysts are oxalic, hydrochloric and methanesulfonic acid. The effective catalyst concentration necessary to conduct the reaction will depend on the acid strength, temperature and reaction environment. Typical catalyst concentration may vary from 1 to 15 % relative to the reactive phenol weight. Once the reaction is completed the solution is slowly added to a non-solvent of the polymer to cause precipitation. The product is then collected, washed and dried.

A typical process for forming the alternating block copolymer in which formaldehyde or other lower alkyl aldehyde is used comprises the following steps. The reactive phenol, bishydroxymethylated phenol, water, solvent and catalyst are added to a resin reactor and the mixture gently heated to about 70° C. to initiate the reaction forming the alternating copolymer. At about 100° C. the aldehyde is slowly added to the reaction mixture to form substantially phenol-methylene polymer segments and to chemically bond these segments to the previously formed alternating copolymer. After about 3 to 6 hours reflux, heat is applied to distill off the water and solvent. When the temperature of the reaction mixtures reaches about 210°–220° C., vacuum is applied to remove the unreacted phenol. The resin melt is then poured into a tray and allowed to cool and solidify. This reaction may also be conducted in solution as above. However, hydrochloric acid is not used when formaldehyde is present due to the formation of toxic byproducts.

The alternating block copolymers containing aromatic aldehyde, due to high resin glass transition and melt viscosity, are normally made by a solution process.

The alternating copolymers and alternating block copolymers made with an aliphatic aldehyde are characterized by enhanced ortho-, ortho-coupling, weight average molecular weight of about 1500 to 5500 Daltons, polydispersity of 1.6 to 4, and a glass transition temperature of about 85° to 150° C.

The aromatic novolak resins used to form photoresists by condensation with an o-quinonediazide sulfonyl compound in accordance with this invention are preferably those having a molecular weight of at least 1200 Daltons and more preferably, a molecular weight ranging between 1700 and 3000 Daltons; a glass transition temperature of at least 85° C. and preferably from about 130° C. to 220° C.; a polydispersity (ratio of weight average molecular weight to number average molecular weight) of from 1.6 to 4.0; and a dissolution rate in a standard developer (polymer prior to esterification) of at least 200 Angstroms per second and more preferably, from about 1200 to 3500 Angstroms per second.

Though aromatic novolak resins are preferred for purposes of this invention, the high molecular weight polyhydric phenol photoactive compounds reduce the incidence of standing waves with conventional alkali-soluble novolak resins esterified with an o-quinonediazide sulfonyl compound where esterification is limited to 20 percent of the phenolic hydroxyl groups. Typical esterified novolak resins are disclosed in U.S. Pat. Nos. 3,046,120; 3,635,709; 4,306,011; 4,308,368; and 5,145,763; U.K. published patent application No 2,172,117A; and European published patent application No. 0,110,214A1, each incorporated herein by reference.

In accordance with the invention, an esterified novolak resin is combined with an additional photoactive component that is the esterification product of an o-quinonediazide sulfonyl compound and a high molecular weight phenol having from two to five phenolic rings and at least four hydroxyl groups where an average of at least 50 percent of phenolic hydroxyl groups are esterified with o-quinonediazide sulfonyl groups. Preferred polyhydric phenols have at least two phenyl rings and at least two hydroxyl groups. Most preferred polyhydric monomeric phenols conform to the general formula:

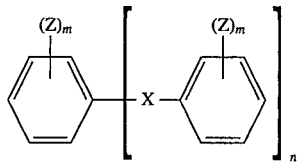

where each Z independently may be the same or different and each is a member selected from the group consisting essentially of a hydrogen atom, an alkyl group, an aryl group, a halogen atom or a hydroxyl group, provided that at least four of said Z's are hydroxyl and preferably, there is at least one hydroxyl group on each ring; each m is a whole integer varying between 1 and 6; X is a single bond or a member from the group consisting essentially of CO, S, O, $SO_2$, and $CR_1$ and $R_2$ where $R_1$ and $R_2$ each is independently a member selected from the group consisting of hydrogen, halogen, hydroxy, alkyl having 1 to 6 carbon atoms, alkoxy having 1 to 6 carbon atoms, and aryl and n is a whole integer varying between 1 and 4. Compounds corresponding to the above formula are known in the art and disclosed in multiple publications including U.K. Patent No. 935,250; EPO published application No. 0 341 608 A2, U.S. Pat. Nos. 3,188,210; 4,266,000; 4,424,270; 4,555,469; and 5,290,656; each incorporated herein by reference. Suitable phenols represented by the above formula include 2,2',3,4-tetrahydroxybenzophenone, 2,4,2',4'-tetrahydroxydiphenyl sulfide, 2,2',4,4'-tetrahydroxydinaphthylmethane, 2,3,4,4'-tetrahydroxy-2,2'-methyl-5,5'-di-tert-butyldiphenyl sulfide, 4,4'-dihydroxydiphenyl sulfide, 4,6-bis-(2,4-dihydroxyphenylthio)-resorcinol, 2,4,2',4'-tetrahydroxy-3,5,3',5'-tetrabromodiphenyl sulfone, 2,4,2',4'-tetrahydroxy-3,5,3',5'-tetrabromobiphenyl and 2,2',4,4'-tetrahydroxy-3,5-dibromobenzophenone.

In accordance with the invention, both the novolak resins and the polyhydric, polynuclear phenols are esterified with an o-quinonediazide sulfonyl compound. Examples of suitable o-naphthoquinonediazide groups include a 1,2-naphthoquinonediazide-4-sulfonyl group, a 1,2-naphthoquinonediazide- 5-sulfonyl group, a 2,1-naphthoquinonediazide-4-sulfonyl group, a 2,1-naphthoquinonediazide- 6-sulfonyl group, a 2,1-naphthoquinonediazide-7-sulfonyl group, and a 2,1-naphthoquinonediazide-8-sulfonyl group. These groups may be used alone or in combination as a mixture. Among these groups, a 1,2-naphthoquinonediazide-4-sulfonyl group and a 1,2-naphthoquinonediazide- 5-sulfonyl group are particularly preferred.

The condensation reaction with the o-quinonediazide sulfonyl halide is carried out in a water miscible, non-interfering or inert solvent. Normally, the material to be esterified and the sulfonyl chloride are dissolved in acetone or dioxane forming an 8 to 25 w/w% solution. The solution temperature is adjusted and a solution of an organic base such as triethylamine (10 to 50 w/w %) which is slowly added to drive the reaction. This is followed by a reaction period of about 0.5 to 4 hours at a constant temperature. Normal reaction temperatures may vary from about 20° to 40° C. If the salt byproduct forms a precipitate, it is filtered and the filtrate neutralized with a mineral acid such as hydrochloric acid. If appropriate, the solution is filtered and then it is added to a non-solvent such as water to separate the esters from the solvent. After collection and washing, the product is dried under reduced pressure at about 30° to 55° C. When a 1,2-naphthoquinonediazide-4-sulfonate is used, the product is imaged at a wavelength of within the range of from 330 to 420 nm. When a 1,2-naphthoquinonediazide-5-sulfonate is used, the photoresist is desirably imaged at a wavelength within the range of 330 to 450 nm.

A photoresist is prepared by dissolving the components in a suitable photoresist solvent. Known photoresist solvents include, for example, ether esters such as ethyl cellosolve acetate, methyl cellosolve acetate, and propylene glycol monomethyl ether acetate; ether alcohols such as ethyl cellosolve, methyl cellosolve, anisole, propylene glycol monomethyl ether; carboxylates such as ethyl acetate, butyl acetate and amyl acetate; lactones such as butyrolactone; cyclic ketones such as cyclohexanone and 2-heptanone; carboxylates of di-basic acids such as diethyloxylate and diethylmalonate; dicarboxylates of glycols such as ethylene glycol diacetate and propylene glycol diacetate; and hydroxy carboxylates such as ethyl-2-hydroxy propionate (ethyl lactate), and ethyl-3-hydroxy propionate. Solvents may be used alone or in admixture with each other and may be further mixed with non-solvents for one or more of the constituents. Suitable photoresist coating compositions can contain up to 50 % by weight solids and preferably from 20 to 40 % percent solids.

The photoresist of the invention comprises the esterification products of the novolak resin and the polyhydric, polynuclear phenol. The concentration of each in the photoresist may vary within broad limits and preferably the concentration ratio of the esterification product of the novolak resin to the esterification product of the polyhydric phenol varies between 1:10 and 10:1 and more preferably, between 1:5 and 5:1.

Other components may be added to the photoresist coating composition. For example, other phenolic resins such as aromatic novolak resins unreacted with the o-quinone diazide component, conventional novolak resins and polyvinyl phenols may be mixed into the photoresist coating composition. The additional phenolic resins may be used in amounts of from 0 to 25 times the amount to the total of the photoactive components, preferably in amounts of 1 to 15 times the amount of the photoactive components and more preferably, in amounts of from 1 to 10 times the amount of the photoactive components. To augment performance, other conventional o-naphthoquinonediazide photoactive compounds may be added to the composition. Such materials are known in the art and disclosed in numerous patents including U.S. Pat. Nos. 3,046,118; 3,046,120; and 5,178,986, all incorporated herein by reference. The concentration of the additional photoactive compound can vary from between 1 and 30 % by weight of the total of the resin components in the photoresist composition, inclusive of the aromatic novolak resin condensed with the o-quinonediazide sulfonyl group, and preferably between 2.5 and 20 %. Other additives that may be added to the photoresist coating composition include actinic and contrast dyes, anti-striation agents, plasticizers and the like as would be known to those skilled in the art.

The following examples will better illustrate the method for preparation of photoresists in accordance with the invention.

GROUP I—Aromatic Resin Formed With Aromatic Aldehyde

EXAMPLE 1

An m-Cresol Salicylaldehyde Resin

A mixture of 183.2 grams salicylaldehyde, 162.2 grams m-cresol, 5.0 grams 3-mercaptopropionic acid, 1.5 grams of a 50 percent aqueous solution of p-toluenesulfonic acid and 200 ml of glacial acetic acid were charged into a 1-liter reaction vessel equipped with a paddle stirrer, reflux condenser and a nitrogen inlet tube. The mixture was heated to reflux and maintained at reflux for 16 hours. The reaction mixture was slowly poured into 7 liters of deionized water to precipitate the resin. Once the solvent had exchanged with water, the product was collected on a filter, slurried once in warm deionized water for about 30 minutes, again collected, rinsed with water and dried in a vacuum oven under about 125 mm Hg and at about 100° C. About 286 grams of a brown powder was obtained.

EXAMPLE 2

An m-Cresol Salicylaldehyde Resin—Additional Example

A mixture of 184.1 grams of salicylaldehyde, 162.2 grams of m-cresol, 5.0 grams of 3-mercaptopropionic acid, 1.5 grams of p-toluenesulfonic acid and 200 ml of glacial acetic acid were charged into a 1-liter reactor vessel equipped with a paddle stirrer, reflux condenser and a nitrogen inlet tube. The mixture was heated to reflux and maintained at reflux for 7.5 hours. The reaction mixture was slowly added to a 7-liter flask of deionized water to precipitate the resin. Once the solvent had exchanged with water, the product was collected on a filter, slurried in warm deionized water for 30 minutes, again collected, rinsed with water and dried in a vacuum oven under 125 mm Hg and at about 105° to 110° C. About 297 grams of a brown powder having a weight average molecular weight of 4,138 Daltons and a polydispersity of 2.1 was collected. Due to the nature of the primary and secondary structure of the resin, its glass transition temperature could not be determined from the differential scanning calorimetry melting curve but it can be stated that it possessed a glass transition temperature in excess of 150° C.

EXAMPLE 3

An o-Cresol Salicylaldehyde Resin

A mixture of 183.6 grams of salicylaldehyde, 162.2 grams of o-cresol, 3.0 grams of 3-mercaptopropionic acid, 1.1 grams of p-toluenesulfonic acid monohydrate and 75 ml of bis(2-methoxyethyl)ether were charged into a 1-liter reaction vessel equipped with a paddle stirrer, reflux condenser and a nitrogen inlet tube. The mixture was heated to reflux and maintained at reflux for 4.0 hours. The more volatile components in the reaction mixture were then removed by distillation at ambient pressure under a constant flow of nitrogen. The mixture temperature was then raised and maintained between 170° and 178° C. for two hours to complete the reaction. Upon cooling, the product mixture was diluted first with 150 ml of glacial acetic acid followed by 300 ml of methanol. The solution was slowly added to 3.2 liters of deionized water to precipitate the resin. Once the solvent had exchanged with water, the product was collected on a filter, slurried in warm deionized water, rinsed with water and dried in a vacuum oven under about 125 mm Hg and at about 115° to 120° C. About 289 grams of a brown powder having a weight average molecular weight of 19,439 Daltons and a polydispersity of 7.32 was obtained. Due to the nature of the primary and secondary structure of the resin, its glass transition temperature could not be determined from the differential scanning calorimetry melting curve but it can be stated that its glass transition temperature exceeded 150° C.

EXAMPLE 4

A p-Cresol Salicylaldehyde Resin

A mixture of 183.2 grams of salicylaldehyde, 162.2 grams of p-cresol, 3.0 grams of 3-mercaptopropionic acid, 1.1 grams of p-toluenesulfonic acid monohydrate and 75 ml of bis(2-methoxyethyl)ether were charged into a 1-liter reactor vessel equipped with a paddle stirrer, reflux condenser and a nitrogen inlet tube. The reaction was carried out according to the procedure of Example 3 to yield about 272.5 grams of resin having a weight average molecular weight of 11,622 Daltons and a polydispersity of 7.39. Due to the nature of the primary and secondary structure of the resin, its glass transition temperature could not be determined from the differential scanning calorimetry melting curve but it can be stated that its glass transition temperature exceeded 150° C.

EXAMPLE 5

An m-Cresol Salicylaldehyde-Benzaldehyde Resin

A mixture of 778.6 grams of m-cresol, 453.1 grams of benzaldehyde, 357.8 grams of salicylaldehyde, 14.5 grams of 3-mercaptopropionic acid, 9.6 grams of p-toluenesulfonic acid monohydrate and 650 ml of propionic acid were charged into a 4-liter reaction vessel equipped with a paddle stirrer, reflux condenser and a nitrogen inlet tube. The mixture was heated to reflux and maintained at reflux for 4 hours. The more volatile components in the reaction mixture were then removed by distillation at ambient pressure under a constant flow of nitrogen. The mixture temperature was then raised and maintained between 141° and 145° C. and allowed to reflux for 1 hour to complete the reaction. Upon dilution with 1.6 liters of propionic acid, the resin solution was precipitated into 14 liters of deionized water. The product was collected on a filter, slurried in 14 liters of deionized water, collected by filtration, rinsed with deionized water and dried at 110° to 115° C. About 1,485 grams of a brown powder having a weight average molecular weight of 1,790 Daltons and a polydispersity of 1.95 was obtained having a glass transition temperature of about 177° C.

EXAMPLE 6

An m-Cresol Salicylaldehyde-Benzaldehyde Resin
An alternative procedure

A mixture of 194.8 grams of m-cresol, 113.4 grams of benzaldehyde, 89.5 grams of salicylaldehyde, 1.0 liters of ethanol and 0.1 liters of concentrated hydrochloric acid were charged into a 2 liter 3-necked round bottom flask equipped with a mechanical stirrer, heating mantle, reflux condenser and a nitrogen inlet tube. The mixture was heated to and kept at reflux for about 24 hours. The reaction mixture was transferred to an addition funnel and slowly added into 6 liters of deionized water to precipitate the product. After a 4-hour soak, the precipitate was collected on a Buckner funnel aided by reduced pressure. The product was rinsed, re-slurried into 6 liters of deionized water and after a 1-hour soak, was again collected on the Buckner filter and rinsed. The resin was partially air dried to remove the bulk of the water and further dried under vacuum at 65° to 68° C. The yield was about 360.4 grams of powder having a glass transition temperature of about 158° C. and a weight average molecular weight of about 1823 Daltons.

EXAMPLES 7–29

Miscellaneous Cresol Aromatic Aldehyde Resins

| Example No. | Monomers | Mole % | Tg. °C. | Molecular Weight Average |
|---|---|---|---|---|
| 7 | m-cresol | 50 | 152 | 2,023 |
|   | benzaldehyde | 50 |  |  |
| 8 | m-cresol | 50 | None obs. | 4,138 |
|   | salicylaldehyde | 50 |  |  |
| 9 | m-cresol | 50 | 164 | 3,038 |
|   | benzaldehyde | 45 |  |  |
|   | salicylaldehyde | 5 |  |  |
| 10 | m-cresol | 50 | 166 | 2,610 |
|   | benzaldehyde | 40 |  |  |
|   | salicylaldehyde | 10 |  |  |
| 11 | m-cresol | 50 | 147 | 1,962 |
|   | benzaldehyde | 38 |  |  |
|   | salicylaldehyde | 12 |  |  |
| 12 | m-cresol | 50 | nm | 2,001 |
|   | benzaldehyde | 36.6 |  |  |
|   | salicylaldehyde | 13.3 |  |  |
| 13 | m-cresol | 50 | nm | 2,317 |
|   | benzaldehyde | 36 |  |  |
|   | salicylaldehyde | 14 |  |  |
| 14 | m-cresol | 50 | 147 | 1,999 |
|   | benzaldehyde | 35 |  |  |
|   | salicylaldehyde | 15 |  |  |
| 15 | m-cresol | 50 | 161 | 2,319 |
|   | benzaldehyde | 25 |  |  |
|   | salicylaldehyde | 25 |  |  |
| 16 | m-cresol | 50 | 189 | 2,826 |
|   | benzaldehyde | 17 |  |  |
|   | salicylaldehyde | 33 |  |  |
| 17 | o-cresol | 50 | 125 | 4,328 |

-continued

Miscellaneous Cresol Aromatic Aldehyde Resins

| Example No. | Monomers | Mole % | Tg. °C. | Molecular Weight Average |
|---|---|---|---|---|
|   | benzaldehyde | 30 |  |  |
|   | salicylaldehyde | 20 |  |  |
| 18 | o-cresol | 50 | 132 | 4,446 |
|   | benzaldehyde | 25 |  |  |
|   | salicylaldehyde | 25 |  |  |
| 19 | o-cresol | 50 | 134 | 6,610 |
|   | benzaldehyde | 20 |  |  |
|   | salicylaldehyde | 30 |  |  |
| 20 | m-cresol | 43.3 | 133 | 1,667 |
|   | p-cresol | 13.3 |  |  |
|   | benzaldehyde | 26 |  |  |
|   | salicylaldehyde | 24 |  |  |
| 21 | m-cresol | 43.3 | 131 | 3,041 |
|   | o-cresol | 13.3 |  |  |
|   | benzaldehyde | 26 |  |  |
| 22 | m-cresol | 33 | 138 | 2,007 |
|   | o-cresol | 17 |  |  |
|   | benzaldehyde | 30 |  |  |
|   | salicylaldehyde | 20 |  |  |
| 23 | m-cresol | 25 | 125 | 2,343 |
|   | o-cresol | 25 |  |  |
|   | benzaldehyde | 30 |  |  |
|   | salicylaldehyde | 20 |  |  |
| 24 | m-cresol | 17 | 131 | 2,564 |
|   | o-cresol | 33 |  |  |
|   | benzaldehyde | 30 |  |  |
|   | salicylaldehyde | 20 |  |  |
| 25 | o-cresol | 50 | 132 | 4,446 |
|   | salicylaldehyde | 25 |  |  |
|   | benzaldehyde | 25 |  |  |
| 26 | m-cresol | 33 | 138 | 2,007 |
|   | o-cresol | 17 |  |  |
|   | benzaldehyde | 30 |  |  |
|   | salicylaldehyde | 20 |  |  |
| 27 | m-cresol | 43.3 | 133 | 1,667 |
|   | p-cresol | 13.3 |  |  |
|   | benzaldehyde | 26 |  |  |
|   | salicylaldehyde | 24 |  |  |
| 28 | m-cresol | 50 | 147 | 1,671 |
|   | 3-hydroxybenzaldehyde | 50 |  |  |
| 29 | m-cresol | 50 | nm | 1,451 |
|   | 4-hydroxybenzaldehyde | 50 |  |  |

GROUP II—Aromatic Resins Formed From Bis(hydroxymethyl)phenol

EXAMPLE 30

An m-Cresol Salicylaldehyde 2,6-bis(hydroxymethyl)-p-Cresol Resin

A mixture of 146.0 grams m-cresol, 146.5 grams salicylaldehyde, 25.2 grams 2,6-bis(hydroxymethyl)p-cresol, 5.0 grams 3-mercaptopropionic acid and 1.5 grams p-toluenesulfonic acid monohydrate in 200 ml glacial acetic acid was reacted as described in Example 1 and about 281 grams of resin was obtained. The resin had a glass transition temperature of 233° C. and a molecular weight of about 4,085 Daltons with a weight average molecular weight to a number average molecular weight of 2.77.

EXAMPLE 31

A Resin Formed From m-Cresol and 2,6 Bis(hydroxymethyl)-p-cresol

A 2-L four-neck resin kettle equipped with a stirrer, heating source, thermometer, variable reflux ratio distilling head and a nitrogen inlet tube was charged with 129.8 g m-cresol, 134.5 g 2,6-bis(hydroxymethyl)-p-cresol, 20 ml deionized water, 5.0 g oxalic acid dihydrate and 50 ml ethyl cellosolve acetate. The mixture was heated to about 60° C. at which point an exothermic condensation reaction ensued. The reaction was allowed to continue for about 4 hours at reflux temperature. The more volatile components in the reaction mixture were removed by distillation at ambient pressure under a constant flow of nitrogen. When the temperature of the reaction mixture reached about 220° C., a partial vacuum pressure was applied and was gradually increased until a maximum vacuum of 7 mm Hg was achieved and the mixture was at about 228° C. The liquefied resin remaining in the kettle was poured into a tray under nitrogen and allowed to cool and solidify. About 217 g of an alternating resin having a number average molecular weight, $M_n$, of 1640 Daltons and a Tg of 106° C. were obtained.

EXAMPLE 32

A 2,5-Dimethylphenol-Bishydroxymethyl-p-cresol Resin

A mixture of 2,5-dimethylphenol (12.22g, 0.1 mol), 2,6-bis(hydroxymethyl)-p-cresol (11.20 g, 0.0667 mol) and 95 ml of monomethyl ether of propylene glycol was charged into a 250 ml 2-necked round bottom flask equipped with a heating mantel, mechanical stirrer and reflux condenser. Concentrated hydrochloric acid (10ml) was added and the mixture gently heated to reflux and kept at reflux for 5 hours. The solution was then cooled and dropwise added into about 1.8 L of deionized water to precipitate the polymer. The product was collected on a filter, air-dried and then further dried at about 85° C. in a vacuum oven. About 19.3 g of a light powder was obtained having a glass transition temperature of about 95° C., weight average molecular weight of about 1570 Daltons and a polydispersity of 1.65.

EXAMPLE 33

A 2,3-Dimethylphenol, 2-Methylresorcinol, Bishydroxymethyl-p-cresol Resin

A mixture of 2,3-dimethylphenol (7.33 g, 0.06 mol), 2,6-bis(hydroxymethyl)-p-cresol (11.37 g, 0.0677 mol), 2-methylresorcinol (3.25 g, 0.0262 mol) and 95 ml of monomethyl ether of propylene glycol was charged into a 250 ml 2-necked round bottom flask equipped with a heating mantel, mechanical stirrer and reflux condenser. Concentrated hydrochloric acid (10 ml) was added to the flask and the mixture gently heated to reflux and kept at reflux for 5 hours. The solution was then cooled and dropwise added into about 1.8 L of deionized water to precipitate the polymer. The product was collected on a filter, air dried and then further dried at about 85° C. in a vacuum oven. About 19.3 g of a light pink powder was obtained having a glass transition temperature of about 126° C., weight average molecular weight of about 2894 Daltons and a polydispersity of 1.91.

EXAMPLE 34

A 4,4'-isopropylenebisphenol-Bishydroxymethyl-p-cresol Resin

A 1.0 L round-bottom flask equipped with a stirrer, condenser, thermometer and a gas inlet tube was charged with 50.0 g (0.22 mole) of 4,4'-isopropylenebisphenol, 36.8 g (0.22 mol) of bishydroxymethyl-p-cresol and 500 ml of 1,4-dioxane. The reaction mixture was saturated with anhydrous hydrochloric acid and allowed to stand at ambient temperature for about 15 hours. After a portion of the hydrochloric acid was expelled by heating to 95° C. the reaction mixture was cooled and then slowly added to about 3.0 L of deionized water. The product layer was separated, washed with water and dried in a vacuum oven at 60° C. The product was then dissolved in 200 ml of acetone, precipitated into about 1.6 L of deionized water, collected on a filter, rinsed with water and again dried under vacuum at 60° C. About 63 g of a tan product was obtained having a glass transition temperature of 88° C.

GROUP III—Alternating Block Copolymers Formed By Reaction Of Alternating Copolymer With Aldehyde

EXAMPLE 35

A Resin Formed From m-Cresol, 2,6-Bis(hydroxymethyl)-p-cresol and 1-Naphthol

A mixture comprised of 72.1 g 1-naphthol, 84.1 g 2,6-bis(hydroxymethyl)-p-cresol, 5.0 g oxalic acid dihydrate, and 150 ml ethyl cellosolve acetate in a 0.5-L resin kettle, equipped as in Example 30, was heated to initiate the condensation reaction substantially forming the 1-naphthol-methylene-p-cresol alternating copolymer. An exothermic reaction resulted, reaching a peak temperature of about 120° C. The reaction mixture was allowed to reflux for about 2 hours, 108.1 g m-cresol and 48.8 g of 36.9 percent formaldehyde were added, and the condensation mixture again allowed to reflux for about 2 hours. The volatiles present in the reaction mixture were removed by distillation and stripping as described in Example 1. About 201 g of a block copolymer having a number average molecular weight, $M_n$, of 1940 Daltons and a Tg of about 121 ° C. were obtained.

EXAMPLE 36

An m-Cresol, Salicylaldehyde and 2,6-Bis(hydroxymethyl)-p-cresol Resin

A mixture of 146.0 g m-cresol, 25.2 g 2,6-bis(hydroxymethyl)-p-cresol, 5.0 g 3-mercaptopropionic acid and 1.5 g p-toluenesulfonic acid monohydrate in 200 ml glacial acetic acid were charged into a 1-L reaction vessel equipped with a paddle stirrer, reflux condenser and a nitrogen inlet tube. The mixture was heated to reflux and maintained at reflux to allow formation of the alternating copolymer. After 8 hours, 146.5 g salicylaldehyde were added over time to the reaction mixture to form alternating copolymer segments bonded with salicylaldehyde to form the block segments. Reflux was continued for 8 hours. The reaction mixture was slowly poured into 7 L deionized water to precipitate the resin. Once the solvent had exchanged with water, the product was collected on a filter, slurried once in warm deionized water for about 30 minutes, again collected, rinsed with water and dried in a vacuum oven under about 125 mm Hg and at about 100° to 105° C. About 281 g of a block copolymer resin having a number average molecular weight, $M_n$, of 1472 Daltons and a Tg of 233° C. were obtained.

EXAMPLE 37

A Resin Formed From m-Cresol and 2,6-Bis(hydroxymethyl)-o-cresol and Formaldehyde A phenolic resin rich in alternating phenolic copolymer block segments was formed by reacting a mixture of 519.0 g of 99 percent pure m-cresol, 538.2 g of 97 percent pure 2,6-bis(hydroxymethyl)-p-cresol and 20 g oxalic acid dihydrate in a solvent mixture of 40 ml deionized water and 200 ml ethyl cellosolve acetate. The reaction mixture was heated to about 70° C. to initiate the reaction forming the alternating copolymer. At 102° C., 32.6 g of 36.9 percent formaldehyde was added in 8 minutes to the reaction mixture to form substantially m-cresol formaldehyde block segments and to chemically bond these segments to the previously formed alternating copolymer. After heating the mixture at reflux for three hours, the amount of heat was increased to remove the water and solvent by distillation. Partial vacuum was applied at about 220° C. and gradually increased to 4 mm Hg to remove the unreacted monomers. Maximum mixture temperature during vacuum stripping was about 226° C. The copolymer was poured from the reaction kettle and allowed to cool. About 840 g of a block copolymer having a number average molecular weight number, $M_n$, of 1241 Daltons and a Tg of 112° C. were obtained.

EXAMPLE 38

A m-Cresol, 2,3,5-Trimethylphenol Bishydroxymethyl-p-cresol, Formaldehyde Resin To a 2 L resin kettle equipped with mechanical agitator, heating mantle, reflux condenser with a variable distillation head, thermometer and nitrogen inlet tube a mixture was added comprising 432.6 g of m-cresol, 148.6 g of 2,3,5-trimethylphenol, 463.3 g of bishydroxymethyl-p-cresol, 180 g of propyleneglycol methyl ether acetate, 36 g of water and 9.1 g of oxalic acid dihydrate. The mixture was heated to reflux and 127.9 g of 37.2 % formaldehyde was added over a 25 minute period. After 3 hours of reflux, the amount of heat was increased to remove the water and solvent by distillation. Partial vacuum was applied at about 215° C. and gradually increased to 0.9 mm Hg to remove the unreacted monomers. Once the batch temperature again reached 215° C. the resin was poured from the reaction kettle and allowed to cool. About 871 g of resin was obtained having a Tg of 113° C., a weight average molecular weight of 2193 Daltons and a polydispersity of 2.04.

GROUP IV—Synthesis of Random Phenolic-Formaldehyde Novolak Resins

EXAMPLE 39

A 2 L four-necked resin kettle equipped with a stirrer, heating mantel, thermometer, water cooled condenser and nitrogen inlet/outlet ports was charged with 278.3 g (99%) m-cresol, 335.5 g (99%) p-cresol, 34.3 g (99%) o-cresol, 68.3 g of formalin, 20 g deionized water and 12.0 g of oxalic acid dihydrate. The mixture was gently heated to reflux and while at reflux 273.3 g of the formalin was added in about one hour. The reaction was then allowed to continue for about four hours at reflux temperature. The more volatile components in the reaction mixture were removed by distillation at ambient pressure under a constant flow of nitrogen. when the temperature of the reaction mixture reached about 220° C., a partial vacuum pressure was applied and was gradually increased until a maximum vacuum of 7 mmHg was achieved. The vacuum was interrupted with nitrogen and the resin melt poured into a tray and cooled under nitrogen. About 516 g of novolak resin having a Tg of about 100° C.

EXAMPLES 40–46

Following generally the procedure of Example 39, additional novolak resins were prepared using various combinations of monomers. the phenolic monomers, their mole ratio, Tg and weight average molecular weight of the polymers formed are set forth in the following table:

| Example No. | Monomers | Mole % | Tg. °C. | Molecular Weight Average |
|---|---|---|---|---|
| 40 | m-cresol | 39.0 | 101 | 5,070 |
|  | p-cresol | 55.5 |  |  |
|  | 2,3-xylenol | 5.5 |  |  |
| 41 | m-cresol | 34.5 | 92 | 2,880 |
|  | p-cresol | 55.5 |  |  |
|  | 2,3,5-trimethylphenol | 10.0 |  |  |
| 42 | m-cresol | 43.5 | 107 | 6,940 |
|  | p-cresol | 51.0 |  |  |
|  | 2,5-xylenol | 5.5 |  |  |
| 43 | m-cresol | 39.0 | 101 | 3,880 |
|  | p-cresol | 55.5 |  |  |
|  | 3,5-xylenol | 5.5 |  |  |
| 44 | m-cresol | 25.0 | 93 | 3,340 |
|  | p-cresol | 60.0 |  |  |
|  | 2,5-xylenol | 15.0 |  |  |
| 45 | m-cresol | 25.0 | 100 | 3,850 |
|  | p-cresol | 50.0 |  |  |
|  | 2,5-xylenol | 25.0 |  |  |
| 46 | m-cresol | 42.0 | 102 | 5,560 |
|  | p-cresol | 58.0 |  |  |

GROUP V—Polymers Formed By Esterifying Aromatic Resins with o-Naphthoquinonediazide Group

EXAMPLE 47 o-Naphthoquinonediazide Esterified Aromatic Resins

A 1-L 3-necked round bottom flask equipped with a water bath, stirrer and thermometer was charged with 700 mL of acetone, 100 g of aromatic resin prepared according to Example 5 and having a dissolution rate of about 560 A/sec., and 16.32 g of 1,2-naphthoquinone-(2)-diazide- 5-sulfonyl chloride. The mixture was warmed up to about 30° C. and a base solution comprising about 7.74 g of triethylamine in 25 mL acetone was slowly added in about 15 minutes. The reaction mixture was then maintained at about 30° C. for about 2 hours to complete the esterification reaction. After this period, the excess base was neutralized with hydrochloric acid and the solution slowly added to about 7 L of deionized water to precipitate the product. The product was collected using a Buchner funnel assisted by a partial vacuum, rinsed with water and reslurried in 3 L of water. Again, the product was collected with the funnel, rinsed with water and partially air dried on the filter. Final drying was achieved at about 40° to 50° C. under vacuum. About 110 g of esterified aromatic resin containing about 8.5 percent 1,2-naphthoquinone-( 2)-diazide-5-sulfonic acid ester groups was obtained.

EXAMPLES 48 to 52

Misc. Esterified Aromatic Resins

Under similar reaction conditions other 1,2-naphthoquinone-(2)-diazide-5-sulfonic acid esterified aromatic resins (Examples 40–43) of the invention were prepared. Table 1 sets out the precursor resin used and resulting percent esterification.

| Example | Resin Precursor Synthesis Procedure according to | Precursor Resin Dissolution Rate, A/sec | Ester % |
|---|---|---|---|
| 48 | Example 6 | 2073 | 12 |
| 49 | Example 38 | 209 | 15 |
| 50 | Example 32 | 1722 | 12 |
| 51 | Example 37 | 46 | 7.5 |
| 52 | Example 39 | n/a | 6.25 |

GROUP V—Formulation and Performance of Photoresist Made In Accordance With Invention

EXAMPLES 53 to 64

The following examples illustrate the preparation and use of photoresists containing the esterified resins in accordance with the invention. Examples 53 to 64 demonstrate positive-working photoresist compositions containing the novel esterified resins of this invention. The photoresist compositions were evaluated by spin coating onto four inch silicon wafers using either a GCA or SVG wafer coater-hot plate track to give approximately a 9700A±25A film of resist and baked at 90° C. for 60 seconds. Initial average film thickness was measured with a Nanometrics 215 instrument. The films were irradiated using a GCA XLS, 0.55 NA i-line stepper and then subjected to a post-exposure bake of 115° C. for 60 seconds. The exposed resists were developed with MF701 developer (a Shipley Co. product) at 21° C. for 60 seconds using a single puddle process. Scanning electron microscopy was used to analyze the resist films in the exposed and unexposed regions and to determine performance characteristics.

EXAMPLES 53–63

| Resist Composition: | |
|---|---|
| Ester of Example 48 | 7.667 g |
| Resin of Example 38 | 11.695 g |
| PAC[1] | 1.515 g |
| PAC[2] | 1.122 g |
| Solvent[3] | 75.360 g |

| Performance: | |
|---|---|
| Photospeed | 81. mJ/cm$^2$ |
| Linearity | 0.340 um |
| Resolution | 0.330 um |
| Wall angle at 0.35 um | 88.0° |
| Depth of Focus at 0.35 um | 0.75 um |

[1]Derived from 2,6-bis(2,4-dihydroxybenzyl)-p-cresol and 1,2-naphthoquinone-(2)-diazide-5-sulfonyl chloride.
[2]Derived from 4-ethylresorcinol and 1,2-naphthoquinone-(2)-diazide-5-sulfonyl chloride.
[3]A mixture comprising ethyl lactate (90 wt %), butylacetate (5 wt %) and xylene (5 wt %).

EXAMPLE 54

| Resist Composition: | |
|---|---|
| Ester of Example 49 | 4.473 g |
| Resin of Example 38 | 14.890 g |
| PAC[1] | 1.515 g |
| PAC[2] | 1.122 g |
| Solvent[3] | 75.360 g |

| Performance: | |
|---|---|
| Photospeed | 124. mJ/cm$^2$ |
| Linearity | 0.345 um |
| Resolution | 0.335 um |
| Wall angle at 0.35 um | 87.0° |
| Depth of Focus at 0.35 um | 0.90 um |

[1]Derived from 2,6-bis(2,4-dihydroxybenzyl)-p-cresol and 1,2-naphthoquinone-(2)-diazide-5-sulfonyl chloride.
[2]Derived from 4-ethylresorcinol and 1,2-naphthoquinone-(2)-diazide-5-sulfonyl chloride.
[3]A mixture comprising ethyl lactate (90 wt %), butylacetate (5 wt %) and xylene (5 wt %).

EXAMPLE 55

| Resist Composition: | |
|---|---|
| Ester of Example 50 | 6.544 g |
| Resin of Example 38 | 12.818 g |
| PAC[1] | 1.515 g |
| PAC[2] | 1.122 g |
| Solvent[3] | 75.360 g |

| Performance: | |
|---|---|
| Photospeed | 68. mJ/cm$^2$ |
| Linearity | 0.370 um |
| Resolution | 0.340 um |
| Wall angle at 0.35 um | n/a |
| Depth of Focus at 0.35 um | 0.90 um |

[1]Derived from 2,6-bis(2,4-dihydroxybenzyl)-p-cresol and 1,2-naphthoquinone-(2)-diazide-5-sulfonyl chloride.
[2]Derived from 4-ethylresorcinol and 1,2-naphthoquinone-(2)-diazide-5-sulfonyl chloride.
[3]A mixture comprising ethyl lactate (90 wt %), butylacetate (5 wt %) and xylene (5 wt %).

EXAMPLE 56

| Resist Composition: | |
|---|---|
| Ester of Example 51 | 10.244 g |
| Resin of Example 37 | 10.244 g |
| PAC[1] | 8.372 g |
| Solvent[4] | 69.53 g |

| Performance: | |
|---|---|
| Photospeed | 102.5 mJ/cm$^2$ |
| Linearity | 0.325 um |
| Resolution | 0.313 um |
| Wall angle at 0.35 um | n/a |
| Depth of Focus at 0.35 um | 0.60 um |

[1]Derived from 2,6-bis(2,4-dihydroxybenzyl)-p-cresol and 1,2-naphthoquinone-(2)-diazide-5-sulfonyl chloride.
[4]A mixture of ethyl lactate (80 wt %), anisole (13 wt %), and amyl acetate (8 wt %).

EXAMPLE 57

| Resist Composition: | |
|---|---|
| Ester of Example 52 | 8.661 g |
| Resin of Example 39 | 12.965 g |
| PAC[1] | 11.570 g |
| Solvent[4] | 66.475 g |

| Performance: | |
|---|---|
| Photospeed | 91.0 mJ/cm$^2$ |
| Resolution | 0.390 μm |

-continued

| | |
|---|---|
| 0.400 μm Depth-of-Focus | 0.7 μm |

[1] Derived from 2,6-bis(2,4-dihydroxybenzyl)-p-cresol and 1,2-naphthoquinone-(2)-diazide-5-sulfonyl chloride.
[4] A mixture of ethyl lactate (80 wt %), anisole (13 wt %), and amyl acetate (8 wt %).

EXAMPLE 58

Resist Composition:

| | |
|---|---|
| Ester of Example 48 | 11.443 g |
| Resin of Example 38 | 8.669 g |
| PAC[1] | 1.888 g |
| Solvent[4] | 75.470 g |

Performance:

| | |
|---|---|
| Photospeed | 77.5 mJ/cm$^2$ |
| Resolution | 0.350 μm |
| 0.35 μm Wall Angle | 87.0° |
| 0.35 μm Depth-of-Focus | 0.30 μm |

[1] Derived from 2,6-bis(2,4-dihydroxybenzyl)-p-cresol and 1,2-naphthoquinone-(2)-diazide-5-sulfonyl chloride.
[4] A mixture of ethyl lactate (80 wt %), anisole (13 wt %), and amyl acetate (8 wt %).

EXAMPLE 59

Resist Composition:

| | |
|---|---|
| Ester of Example 48 | 7.262 g |
| Resin of Example 38 | 12.852 g |
| PAC[1] | 1.889 g |
| Solvent[3] | 75.360 g |

Performance:

| | |
|---|---|
| Photospeed | 124 mJ/cm$^2$ |
| Resolution | 0.330 μm |
| 0.35 μm Wall Angle | 87.5° |
| 0.35 μm Depth-of-Focus | 0.6 μm |

[1] Derived from 2,6-bis(2,4-dihydroxybenzyl)-p-cresol and 1,2-naphthoquinone-(2)-diazide-5-sulfonyl chloride.
[3] A mixture comprising ethyl lactate (90 wt %), butylacetate (5 wt %) and xylene (5 wt %).

EXAMPLE 60

Resist Composition:

| | |
|---|---|
| Ester of Example 51 | 6.615 g |
| Resin of Example 39 | 12.290 g |
| PAC[1] | 3.156 g |
| Solvent[4] | 69.561 g |

Performance:

| | |
|---|---|
| Photospeed | 68 mJ/cm$^2$ |
| Resolution | 0.380 μm |
| 0.425 μm Depth-of-Focus | >1.0 μm |

[1] Derived from 2,6-bis(2,4-dihydroxybenzyl)-p-cresol and 1,2-naphthoquinone-(2)-diazide-5-sulfonyl chloride.
[4] A mixture of ethyl lactate (80 wt %), anisole (13 wt %), and amyl acetate (8 wt %).

EXAMPLE 61

Resist Composition:

| | |
|---|---|
| Ester of Example 48 | 4.277 g |
| Resin of Example 38 | 14.080 g |
| PAC[1] | 1.516 g |
| PAC[5] Derived from 2,6-bis-(4-hydroxybenzyl)-p-cresol | 1.127 g |
| Solvent[4] | 75.359 g |

Performance:

| | |
|---|---|
| Photospeed | 110.0 mJ/cm$^2$ |
| Resolution | 0.345 μm |
| Wall Angle at 0.35 μm | n/m |
| Depth of Focus at 0.35 μm | 0.9 μm |

[1] Derived from 2,6-bis(2,4-dihydroxybenzyl)-p-cresol and 1,2-naphthoquinone-(2)-diazide-5-sulfonyl chloride.
[4] A mixture of ethyl lactate (80 wt %), anisole (13 wt %), and amyl acetate (8 wt %).
[5] Derived from named compound and 1,2-naphthoquinone-(2)-diazide-5-sulfonyl chloride

EXAMPLE 62

Resist Composition:

| | |
|---|---|
| Ester of Example 48 | 6.528 g |
| Resin of Example 44 | 12.901 g |
| PAC[1] | 1.047 g |
| PAC[5] Derived from 2-phenol-bis-(2,3,5-trimethyl-4-phenol) methane | 2.025 g |
| Solvent[4] | 74.804 g |

Performance:

| | |
|---|---|
| Photospeed | 99.0 mJ/cm$^2$ |
| Resolution | 0.320 μm |
| Wall Angle at 0.35 μm | 86.0° |
| Depth of Focus at 0.35 μm | 1.2 μm |

[1] Derived from 2,6-bis(2,4-dihydroxybenzyl)-p-cresol and 1,2-naphthoquinone-(2)-diazide-5-sulfonyl chloride.
[4] A mixture of ethyl lactate (80 wt %), anisole (13 wt %), and amyl acetate (8 wt %).
[5] Derived from named compound and 1,2-naphthoquinone-(2)-diazide-5-sulfonyl chloride

EXAMPLE 63

Resist Composition:

| | |
|---|---|
| Ester of Example 48 | 6.504 g |
| Resin of Example 44 | 13.627 g |
| PAC[5] Derived from Bis(2,4-dihydroxy-3,5-dimethylphenyl) methane | 1.045 g |
| PAC[1] | 1.332 g |
| PAC[5] Derived from Bis(2,4-dihydroxy-3,5-dimethylphenyl) methane | 2.262 g |
| Solvent[4] | 74.804 g |

Performance:

| | |
|---|---|
| Photospeed | 61.7 mJ/cm$^2$ |
| Resolution | 0.330 μm |
| Wall Angle at 0.35 μm | 88.0° |
| Depth of Focus at 0.35 μm | 0.75 μm |

[1] Derived from 2,6-bis(2,4-dihydroxybenzyl)-p-cresol and 1,2-naphthoquinone-(2)-diazide-5-sulfonyl chloride.
[4] A mixture of ethyl lactate (80 wt %), anisole (13 wt %), and amyl acetate (8 wt %).
[5] Derived from named compound and 1,2-naphthoquinone-(2)-diazide-5-sulfonyl chloride

We claim:

1. A light-sensitive photoresist composition comprising a mixture of the esterification product of an alkali-soluble novolak resin having pendant phenolic hydroxyl groups and an o-naphthoquinone diazidesulfonyl halide, said resin having up to a maximum of 20 percent of its pendant hydroxyl groups esterified with said o-naphthoquinone diazidesulfonyl halide, and the esterification product of a phenol having from 2 to 5 phenyl rings and at least four phenolic hydroxyl groups with an o-naphthoquinone diazide sulfonyl halide where at least 50 percent of the phenolic hydroxyl groups are esterified with the o-naphthoquinone diazide sulfonyl halide.

2. The composition of claim 1 including an additional alkali soluble resin free of naphthoquinone diazide sulfonic acid substitution.

3. The composition of claim 2 where the additional resin is a novolak resin.

4. The composition of claim 3 where the novolak resin is the condensation product of a phenol and an aromatic aldehyde.

5. The composition of claim 2 where the ratio of the esterified resin to the esterified phenol varies between 1:10 and 10:1.

6. The composition of claim 2 where the ratio of the esterified resin to the esterified phenol varies between 1:5 and 5:1.

7. The composition of claim 2 where the phenol prior to esterification conforms to the formula:

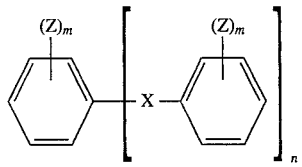

where each Z is independently selected from the group consisting essentially of hydrogen, alkyl having from 1 to 4 carbons, aryl, halo and hydroxy provided that at least 4 of said Zs are hydroxyl; m is a whole integer varying between 1 and 6; X is a member selected from the group consisting of a single bond or a bivalent group linking phenolic rings; and n is a whole integer varying between 1 and 4.

8. The light sensitive composition of claim 7 where the phenol is a bisphenol.

9. The light sensitive composition of claim 8 where the phenol is benzophenone.

10. The light sensitive composition of claim 2 where the novolak resin esterified with the o-naphthoquinone diazide sulfonyl halide contains groups that are the condensation product of a member selected from the group consisting of a phenol and an aromatic aldehyde and a phenol and a bis(hydroxymethyl)phenol.

11. The light sensitive composition of claim 10 where the novolak resin is a block copolymer of a first polymer formed by the condensation of a phenol with an aliphatic aldehyde and the product resulting therefrom is further condensed with an aromatic aldehyde to form a block copolymer.

12. The light sensitive composition of claim 10 where the novolak resin is a block copolymer formed by condensing an alternating copolymer that is the condensation product of a bis(hydroxymethyl)phenol and a reactive phenol with an additional aldehyde.

13. The light sensitive composition of claim 12 where the additional aldehyde is an aromatic aldehyde.

14. The light sensitive composition of claim 10 where the novolak resin is a block copolymer formed by condensing an alternating copolymer that is the condensation product of a bis(hydroxymethyl)phenol and an excess of a reactive phenol with a bis(hydroxymethyl)phenol.

15. A light sensitive composition comprising a mixture of an alkali soluble resin; the esterification product of an alkali-soluble novolak resin having pendant phenolic hydroxyl groups and an o-naphthoquinone diazide sulfonyl halide where a maximum of 20 percent of the pendant hydroxyl groups are esterified with said o-naphthoquinone diazide sulfonyl halide; and the esterification product of an o-naphthoquinone diazide sulfonyl halide compound with a phenol having the formula:

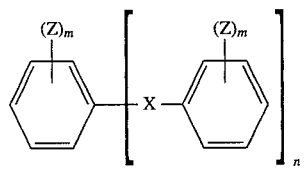

where each Z is independently selected from the group consisting essentially of hydrogen, alkyl having from 1 to 4 carbons, aryl, halo and hydroxyl provided that said phenol has at least 4 Z substitutents and provided further that at least 4 of said Zs are hydroxyl, m is a whole integer varying between 1 and 6, X is a member selected from the group consisting of a single bond and a bivalent group linking phenolic rings, and n is a whole integer varying between 1 and 4 where at least 50 percent of the phenolic hydroxyl groups are esterified with said o-naphthoquinone diazide sulfonyl halide.

16. The composition of claim 15 where the alkali soluble resin is a member selected from the group consisting of a novolak resin and a polyvinyl phenol.

17. The composition of claim 16 where the alkali soluble resin is a novolak resin that is the condensation product of a phenol and an aromatic aldehyde.

18. The composition of claim 15 where the ratio of the esterified resin to the esterified phenol varies between 1:5 and 5:1.

19. The light sensitive composition of claim 15 where the esterification product of the phenol is of a bisphenol.

20. The light sensitive composition of claim 15 where the esterification product of a novolak resin and the o-naphthoquinone diazide compound contains groups that are the condensation product of a member selected from the group consisting of a phenol and an aromatic aldehyde and a phenol and a bis(hydroxymethyl)phenol.

21. The light sensitive composition of claim 20 where the novolak resin is a block copolymer of a first polymer formed by the condensation of a phenol with an aliphatic aldehyde and the product resulting therefrom is further condensed with an aromatic aldehyde to form a block copolymer.

22. The light sensitive composition of claim 20 where the novolak resin is a block copolymer formed by condensing an alternating copolymer that is the condensation product of a bis(hydroxymethyl)phenol and a reactive phenol with an additional aldehyde.

23. The light sensitive composition of claim 22 where the additional aldehyde is an aromatic aldehyde.

24. The light sensitive composition of claim 20 where the novolak resin is a block copolymer formed by condensing an alternating copolymer that is the condensation product of a bis(hydroxymethyl)phenol and an excess of a reactive phenol with a bis(hydroxymethyl)phenol.

* * * * *